United States Patent
Hsieh et al.

(10) Patent No.: US 8,604,669 B2
(45) Date of Patent: Dec. 10, 2013

(54) PASSIVE ALTERNATING CURRENT SENSOR

(75) Inventors: Hsieh-Shen Hsieh, Taoyuan Hsien (TW); Ting-Yi Chung, Taoyuan Hsien (TW); Heng-Chung Chang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 97 days.

(21) Appl. No.: 13/436,238

(22) Filed: Mar. 30, 2012

(65) Prior Publication Data

US 2012/0248936 A1 Oct. 4, 2012

Related U.S. Application Data

(60) Provisional application No. 61/470,796, filed on Apr. 1, 2011.

(51) Int. Cl.
*H01L 41/08* (2006.01)
(52) U.S. Cl.
USPC .......................................... 310/328; 310/339
(58) Field of Classification Search
USPC ....................................................... 310/311
See application file for complete search history.

(56) References Cited

U.S. PATENT DOCUMENTS

| 4,500,838 | A | * | 2/1985 | Bloomer | 324/117 R |
| 6,188,811 | B1 | * | 2/2001 | Blake | 385/12 |
| 6,989,623 | B2 | * | 1/2006 | Zeighami | 310/317 |
| 7,117,754 | B2 | * | 10/2006 | Neely et al. | 73/862.333 |
| 7,642,692 | B1 | * | 1/2010 | Pulskamp | 310/309 |
| 2006/0214759 | A1 | * | 9/2006 | Kawarai | 336/200 |
| 2007/0261493 | A1 | * | 11/2007 | Kim | 73/594 |

* cited by examiner

*Primary Examiner* — Mark Budd
(74) *Attorney, Agent, or Firm* — Muncy, Geissler, Olds & Lowe, PLLC

(57) ABSTRACT

A passive alternating current sensor for sensing a current-carrying conductor is disclosed. The passive alternating current sensor includes a substrate, a magnetic body, at least one coil and a first measuring circuit. The substrate has a flexible structure layer. The magnetic body is disposed correspondingly to the current-carrying conductor and located at one side of the substrate. The coil is disposed on the substrate and correspondingly winds around the magnetic body. The first measuring circuit is connected with the coil. When the magnetic body is subjected to the magnetic field generated by the current-carrying conductor and enabled a relative motion with the coil, the coil produces an induced electromotive force. The first measuring circuit measures the induced electromotive force and accordingly outputs a first induction signal.

10 Claims, 4 Drawing Sheets

PASSIVE ALTERNATING CURRENT SENSOR

CROSS REFERENCE TO RELATED APPLICATIONS

The non-provisional patent application claims priority to U.S. provisional patent application with Ser. No. 61/470,796 filed on Apr. 1, 2011. This and all other extrinsic materials discussed herein are incorporated by reference in their entirety.

BACKGROUND OF THE INVENTION

1. Field of Invention

The present invention relates to a current sensor and, in particular, to a passive alternating current sensor.

2. Related Art

In industries, the current detection is usually applied to the applications of system over-current protection and current control, such as power decay detection, motor overload detection and protection, current mode control for power source, and control system diagnosis.

The conventional current sensors include contact or non-contact sensing methods. The contact sensing method is to configure a sensing circuit for measuring the resistance, inductance, capacitance, or voltage between two ends of the transistor, and then to calculate the sensing current. The non-contact sensing method is to sense the magnetic field around and generated by the current-carrying conductor by the current transformer method, Hall element method or magnetometric resistivity method. Otherwise, the non-contact sensing method may obtain the sensing current by measuring the variation of mechanical energy converted from magnetic energy. The above-mentioned contact and non-contact sensing methods have their respective advantages and disadvantages, and they may be suitable for different applications.

As shown in FIG. 1, a conventional current sensor for detecting the mechanical energy converted from the magnetic energy includes a coil 11 for carrying current, a pressure-resistance element 12, and an MEMS structure layer 13. The coil 11 and the pressure-resistance element 12 are disposed on the MEMS structure layer 13. The coil 11 is located within the magnetic field generated by the current-carrying conductor CC, so that it is subjected to the Lorentz force and applying a force to the MEMS structure layer 13 as well as indirectly to the pressure-resistance element 12 through the MEMS structure layer 13. Accordingly, the impedance of the pressure-resistance element 12 is decreased so as to generate a voltage drop, so that the current value of the current-carrying conductor CC can be obtained. Since the conventional current sensor 1 is a non-contact current sensor, it can prevent the current-carrying conductor CC to be detected from influence and can avoid high power consumption under the detection of the system with large current and power.

However, as mentioned above, the conventional current sensor 1 is an active current sensor, so that the power must be applied to the current sensor 1 for operation. Besides, during the sensing process, once the current flows through the current-carrying conductor CC, the current sensor 1 is always on duty. Thus, the MEMS structure layer 13 must bear the most reciprocating force all the time, so that it is easily out of function due to fatigue and aging. In order to enhance the sensitivity of the current sensor 1, the coil 11 wound with a lot of rounds is configured on the MEMS structure layer 13. However, the power consumption of the coil 11 may cause the MEMS structure layer 13 to generate heat so as to increase the temperature and generate heat stress, which may affect the operation of the current sensor 1.

Therefore, it is an important subject of the present invention to provide a passive alternating current sensor that can perform desired sensing process without being applied by electricity. Besides, the structure layer thereof can resist the fatigue and aging problems, and can prevent from generating heat, which affects the sensing procedure, due to the configured coil with a lot of rounds.

SUMMARY OF THE INVENTION

In view of the foregoing subject, an objective of the present invention is to provide a passive alternating current sensor that can perform desired sensing process without being applied by electricity. Besides, the structure layer thereof can resist the fatigue and aging problems, and can prevent from generating heat, which affects the sensing procedure, due to the configured coil with a lot of rounds.

To achieve the above objective, the present invention discloses a passive alternating current sensor for sensing a current-carrying conductor. The passive alternating current sensor includes a substrate, a magnetic body, at least one coil and a first measuring circuit. The substrate has a flexible structure layer. The magnetic body is disposed correspondingly to the current-carrying conductor and located at one side of the substrate. The coil is disposed on the substrate and correspondingly winds around the magnetic body. The first measuring circuit is connected with the coil. When the magnetic body is subjected to the magnetic field generated by the current-carrying conductor and enabled a relative motion with the coil, the coil produces an induced electromotive force. The first measuring circuit measures the induced electromotive force and accordingly outputs a first induction signal.

In one embodiment, the substrate is a single-crystal silicon substrate.

In one embodiment, the flexible structure layer is a suspended structure layer.

In one embodiment, the coil comprises a metal thin film.

In one embodiment, the passive alternating current sensor further includes an insulating layer disposed between the substrate and the coil.

In one embodiment, the passive alternating current sensor further includes a signal transmitting unit connected with the first measuring circuit. Preferably, the passive alternating current sensor further includes a piezoelectric element disposed on the substrate. The piezoelectric element, the magnetic body, and the flexible structure layer together form a piezoelectric energy harvester. When the magnetic body is subjected to the magnetic field generated by the current-carrying conductor so as to generate a magnetic force, which is applied to the flexible structure layer, the flexible structure layer accordingly generates a stress applied to the piezoelectric element so as to produce a potential difference between two ends of the piezoelectric element for providing energy to the signal transmitting unit.

In one embodiment, the passive alternating current sensor further includes a piezoelectric element disposed on the substrate and a second measuring circuit connecting to the piezoelectric element. When the magnetic body is subjected to the magnetic field generated by the current-carrying conductor so as to generate a magnetic force, which is applied to the flexible structure layer, the flexible structure layer accordingly generates a stress applied to the piezoelectric element so as to produce a potential difference between two ends of the piezoelectric element. Then, the second measuring circuit measures the potential difference between the two ends of the piezoelectric element and outputs the second induction signal according to the potential difference between two ends of the piezoelectric element.

In one embodiment, the piezoelectric element includes a piezoelectric thin film.

As mentioned above, the passive alternating current sensor of the present invention allows the current-carrying conductor to be measured to generate a static magnetic force applied to the magnetic body as well as the flexibility of the suspended structure for enabling the oscillation motion of the magnetic body with respect to the coil, and then measures the inductance current on the coil. This is a non-contact current sensing method, so that it can prevent the affect of the system to be detected. Compared with the prior art, the present invention does not need external electricity for driving the passive alternating current sensor, which means the passive alternating current sensor can generate the necessary electricity for itself, and does not need to configure the coil with a lot of rounds for enhancing its sensitivity. Thus, the present invention can prevent the heat generated by the flexible structure layer caused by the power consumption of the current-carrying coil, which may further affect the operation in the sensing process. Besides, since the flexible structure layer is made of a single-crystal silicon material, the passive alternating current sensor of the present invention can resist the fatigue and aging problems after being used for a long term.

In addition, the present invention combines the piezoelectric element, magnetic body and flexible structure layer, which together form a piezoelectric energy harvester for generating energy to the signal transmitting unit, so that the entire passive alternating current sensor does not need the external power source but can individually operate to sense the current and output the detection result. Accordingly, the present can make the installation of the passive alternating current sensor more easily.

Otherwise, the piezoelectric element, the magnetic body, and the flexible structure layer may be applied to a second measuring circuit, so that the passive alternating current sensor can provide both the electromagnetic and piezoelectric current sensing mechanisms. Accordingly, the sensitivity of the passive alternating current sensor of the present invention can be enhanced, and the application range thereof can be further spread.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
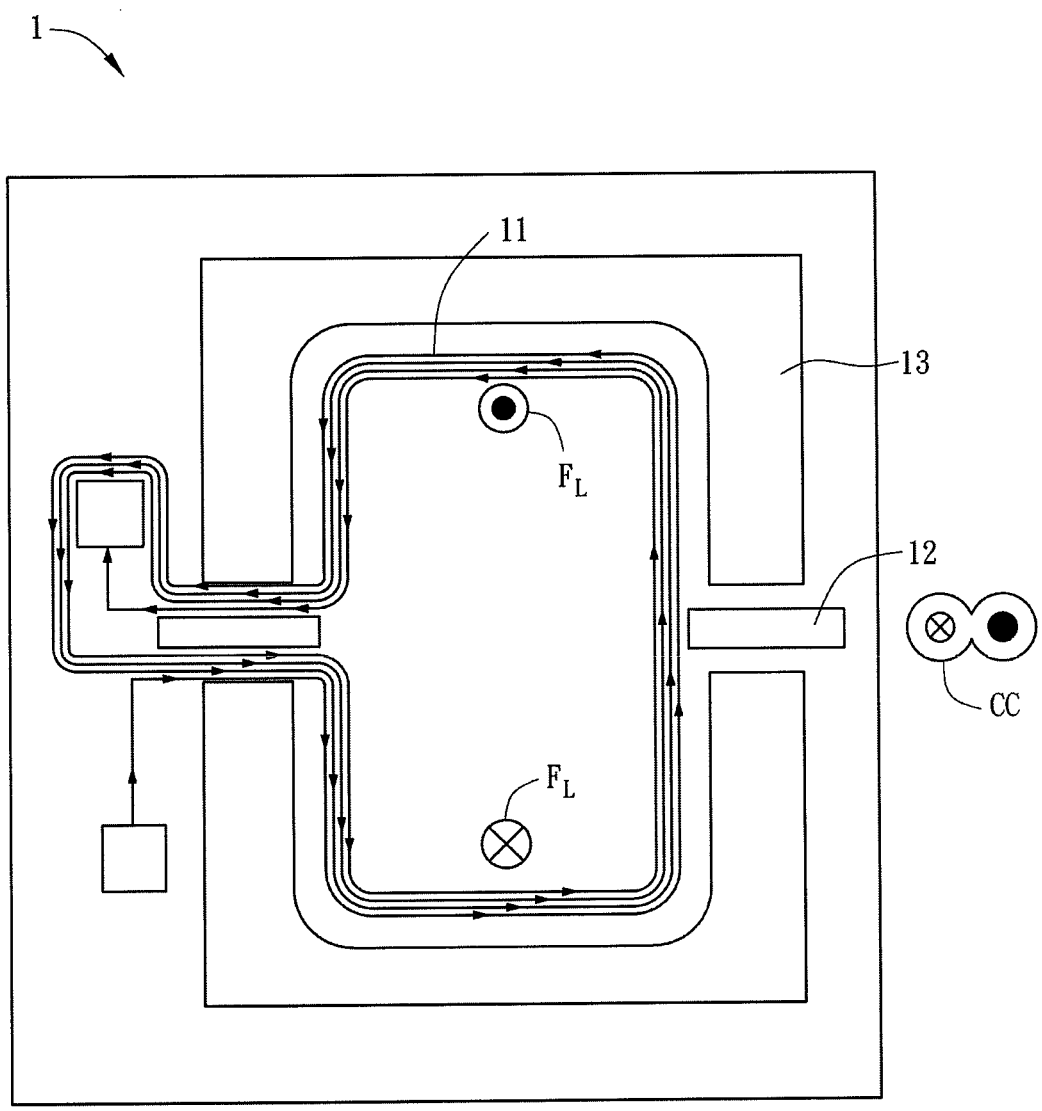
FIG. 1 is a schematic diagram of a conventional current sensor.
Figure 2A:
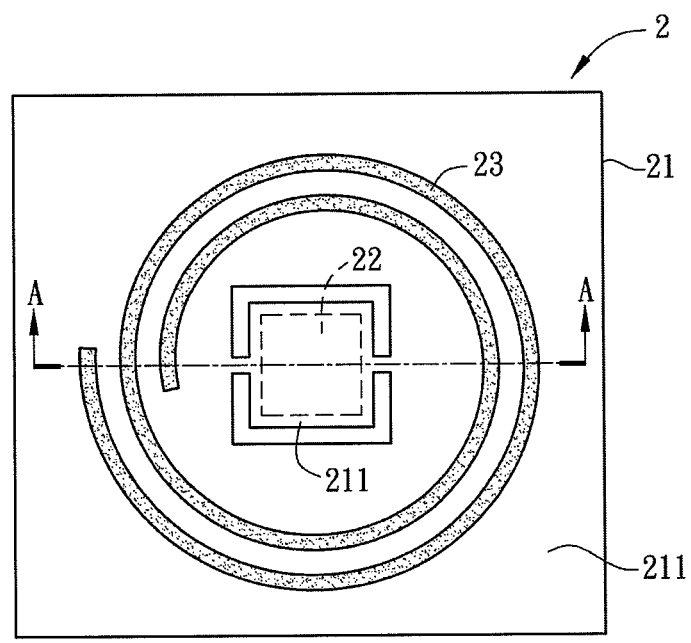
FIG. 2A is a top view showing a part of a passive alternating current sensor according to a first embodiment of the present invention.
Figure 2B:
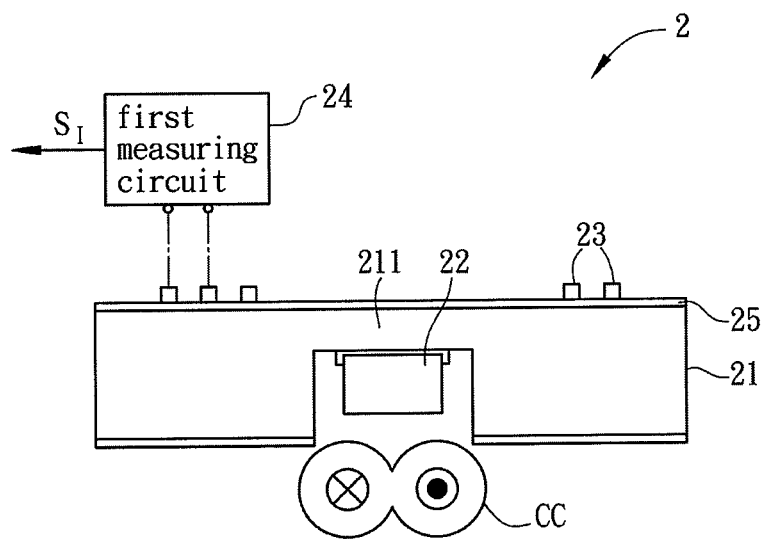
FIG. 2B is a sectional view of the passive alternating current sensor along the line A-A of FIG. 2A.

FIG. 2A is a top view showing a part of a passive alternating current sensor 2 according to a first embodiment of the present invention, and FIG. 2B is a sectional view of the passive alternating current sensor 2 along the line A-A of FIG. 2A. Referring to FIGS. 2A and 2B, the passive alternating current sensor 2 is used for sensing the alternating current of a current-carrying conductor CC. The passive alternating current sensor 2 includes a substrate 21, a magnetic body 22, at least one coil 23 and a first measuring circuit 24.

The substrate 21 has a flexible structure layer 211. In this case, the substrate 21 is a single-crystal silicon substrate, and the flexible structure layer 211 is a suspended structure layer, which contains micro-suspended structures. In practice, the flexible structure layer 211 containing the micro-suspended structures can be manufactured by bulk micromachining the single-crystal silicon substrate according to the MEMS manufacturing processes. The suspended structures are suspended and moveable (along the up-and-down direction) flexible structure such as, for example but not limited to, cantilever, beam, membrane, micro-channel, cavity, joint or hinge, link, crank, gear, rack, spring and the likes. The scale of the micro-suspended structures may be only several micrometers. To be noted, the structure layer made of polycrystal or amorphous silicon is usually containing some defects, so that it may easily generate chinks after being subjected to a stress. On the contrary, since the flexible structure layer 211 is made of single-crystal silicon, which has good mechanical properties and no internal defect, it is able to resist the fatigue and aging problems caused by long-term stress.

The magnetic body 22 is disposed correspondingly to the current-carrying conductor CC and located at one side of the substrate 21. The magnetic body 22 is an object that can generate a magnetic field such as a permanent magnet. To be noted, although the drawings do not illustrate other aspects, the position or height the magnetic body 22 can be adjusted according to the actual demands. For example, the magnetic body 22 may be disposed on the other side of the current-carrying conductor CC away from the substrate 21, or be totally or partially embedded into the substrate 21. These and other modifications can be easily understood by those skilled in the art, and are involved in the scope of the present invention.

At least one coil 23 is disposed on the substrate 21 and correspondingly winds around the magnetic body 22. The coil 23 can be made of conductive metal thin film, so that the entire volume of the passive alternating current sensor 2 is reduced. In this case, there are for example two coils 23, but this is not to limit the number of the coils 23 in this present invention. In practice, the number of the coils 23 may increase/decrease according to the demand of the sensitivity of the passive alternating current sensor 2. Of course, it is possible to configure only a single coil 33 (see FIGS. 3A and 3B). Besides, the passive alternating current sensor 2 of this embodiment further includes an insulation layer 25 disposed between the substrate 21 and the coil 23. The insulation layer 25 is configured to electrically isolate the substrate 21 and the coil 23, and the material thereof includes, for example, rubber polymers, plastic materials, or ceramic insulators.

The first measuring circuit 24 is connected with the coil 23. When the magnetic body 22 is subjected to the magnetic field generated by the current-carrying conductor CC, which has current flowed through, and enabled a relative motion with the coil 23. Accordingly, the coil 23 produces an induced electromotive force to drive the electrons to migrate in the coil 23, thereby generating the induced current. After measuring the coil 23 to obtain the induced electromotive force or induced current, the first measuring circuit 24 calculates and outputs a first current induction signal $S_I$. In more specific, the alternating current flowing through the current-carrying conductor CC has a time-varying electric field, so that a time-varying magnetic field is generated around the current-carrying conductor CC. The magnetic body 22 of the passive alternating current sensor 2 is subjected to the above-mentioned time-varying magnetic field, so that a reciprocating static magnetic force is applied to the magnetic body 22, thereby enabling a relative motion between the flexible structure layer 211 and the coil 23. Accordingly, the coil 23 generates an oscillating motion with respect to the coil 23. Based on the law of electromagnetic induction, the coil 23 produces an induced electromotive force for driving the induced current to flow. Then, the first measuring circuit 24 can output the first current induction signal $S_I$ based on the measured induced electromotive force or induced current.

Figure 3A:
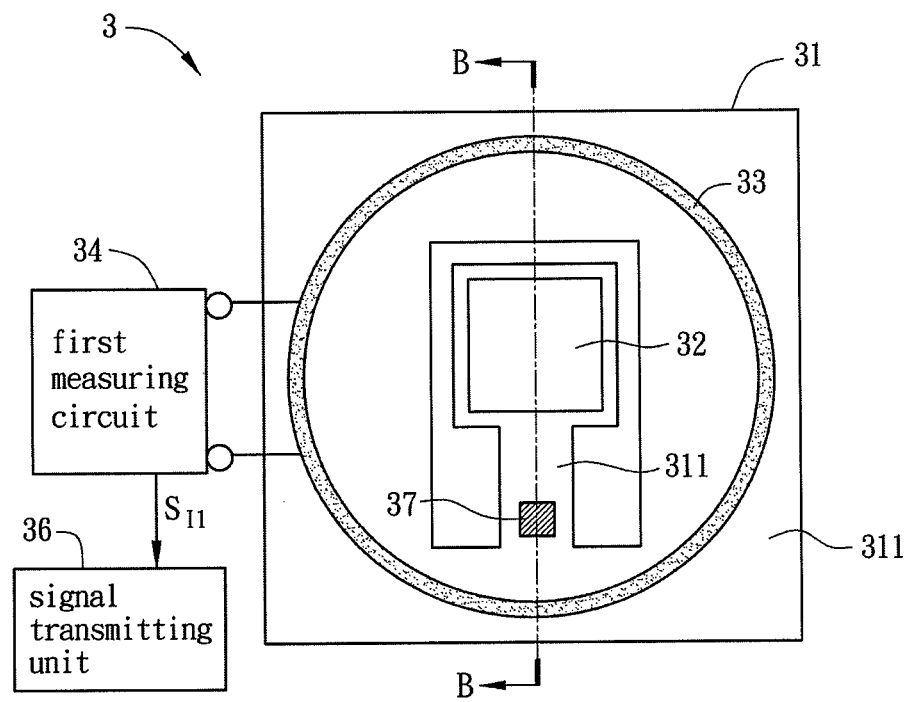
FIG. 3A is a top view of a passive alternating current sensor according to a second embodiment of the present invention.
Figure 3B:
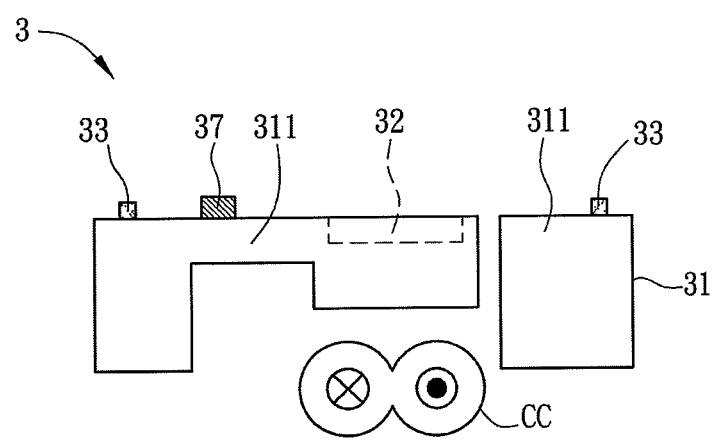
FIG. 3B is a sectional view of the passive alternating current sensor along the line B-B of FIG. 3A.

FIG. 3A is a top view of a passive alternating current sensor 3 according to a second embodiment of the present invention, and FIG. 3B is a sectional view of the passive alternating current sensor 3 along the line B-B of FIG. 3A. In this embodiment, the passive alternating current sensor 3, other than the structures of the passive alternating current sensor 2 of the first embodiment, further includes a signal transmitting unit 36 connected with the first measuring circuit 34. The current induction signal $S_I$ outputted by the first measuring circuit 34 can be transmitted as a wired or wireless signal through the signal transmitting unit 36 to a control computer or a sensing apparatus, thereby enhancing the convenience during the sensing current process.

In order to provide sufficient power for the signal transmitting unit 36 to successfully transmit the wireless signal, the passive alternating current sensor 3 may further include a piezoelectric element 37 disposed at the opposite side of the substrate 31 (the side as the coil 33). The piezoelectric element 37 is formed by a layer of piezoelectric thin film, which is made of PZT, PVDF, ZnO, or Rochelle salt (potassium sodium tartrate). When the piezoelectric element 37 is subjected to a mechanical stress, it is deformed and two ends thereof may accordingly generate charges, which is proportion to the applied stress. In this case, the piezoelectric element 37, the magnetic body 32, and the flexible structure layer 311 together form a piezoelectric energy harvester, which can harvest the oscillation energy and convert it into electricity. The generated electricity can be supplied to the signal transmitting unit 36 for successfully transmitting the signals. In more details, when the magnetic body 32 is subjected to the magnetic field generated by the current-carrying conductor CC so as to generate a magnetic force, which is applied to the flexible structure layer 311, the flexible structure layer 311 accordingly generates a stress applied to the piezoelectric element 37 so as to produce a potential difference between two ends of the piezoelectric element 37 for providing energy to the signal transmitting unit 36. This feature can achieve the purpose of self powering. To be noted, although the drawings illustrate that the magnetic body 32 is embedded into the substrate 31, the position or height the magnetic body 32 can be adjusted according to the actual demands. For example, the magnetic body 32 may be disposed on one side of the current-carrying conductor CC close to the substrate 31, or the other side thereof away from the substrate 21. These and other modifications can be easily understood by those skilled in the art, and are involved in the scope of the present invention.

Figure 4A:
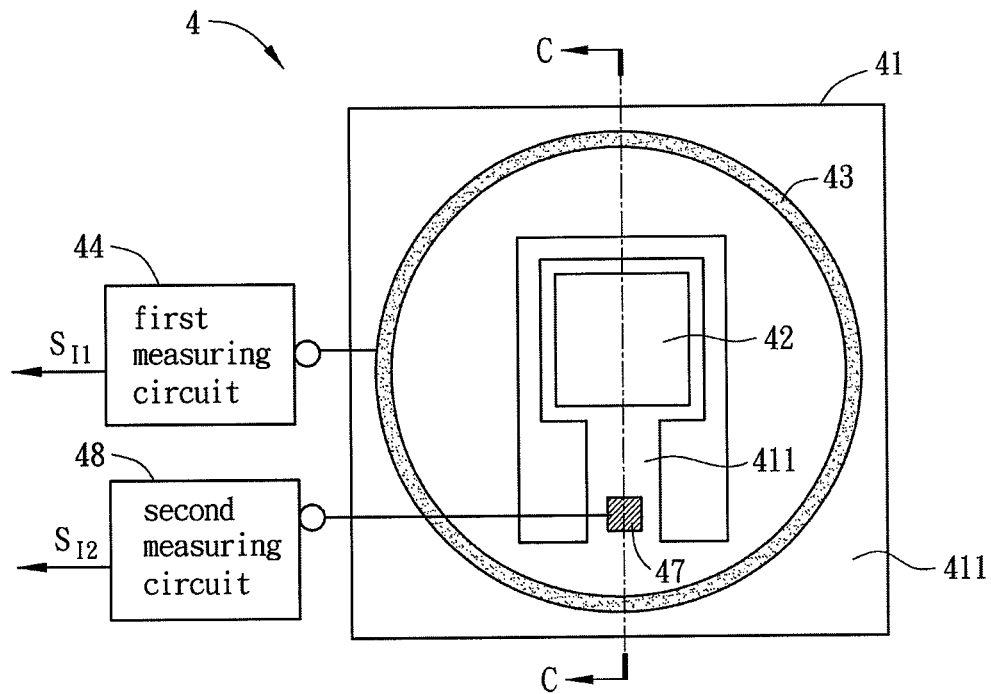
FIG. 4A is a top view of a passive alternating current sensor according to a third embodiment of the present invention.
Figure 4B:
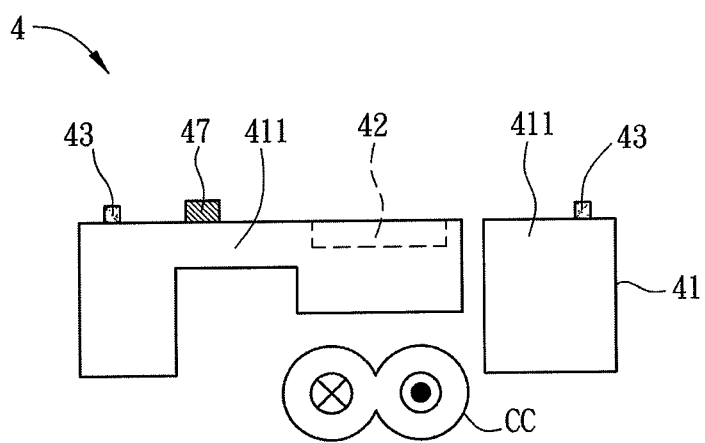
FIG. 4B is a sectional view of the passive alternating current sensor along the line C-C of FIG. 4A.

To be noted, except the above-mentioned piezoelectric energy harvester, the piezoelectric element 37, the magnetic body 32, and the flexible structure layer 311 may be applied to a second measuring circuit for enhancing the sensitivity of the passive alternating current sensor 3. FIG. 4A is a top view of a passive alternating current sensor 4 according to a third embodiment of the present invention, and FIG. 4B is a sectional view of the passive alternating current sensor 4 along the line C-C of FIG. 4A. In this embodiment, the passive alternating current sensor 4 comprises a magnetic body 42 and a flexible structure layer 411, and a second measuring circuit 48 connects to a piezoelectric element 47. The operation of the passive alternating current sensor 4 will be described hereinafter. When the magnetic body 42 is subjected to the magnetic field generated by the current-carrying conductor CC so as to generate a magnetic force, which is applied to the flexible structure layer 411, the flexible structure layer 411 accordingly generates a stress applied to the piezoelectric element 47 so as to produce a potential difference between two ends of the piezoelectric element 47. Then, the first measuring circuit 44 measures the induced electromotive force of the coil 43, and then outputs the first induction signal $S_{I1}$ accordingly. Besides, the second measuring circuit 48 measures the potential difference between two ends of the piezoelectric element 47, and then outputs the second induction signal $S_{I2}$ accordingly. As a result, the configuration of the second measuring circuit 48 can further enhance the sensitivity of the passive alternating current sensor 4.

In summary, the passive alternating current sensor of the present invention allows the current-carrying conductor to be measured to generate a static magnetic force applied to the magnetic body as well as the flexibility of the suspended structure for enabling the oscillation motion of the magnetic body with respect to the coil, and then measures the inductance current on the coil. This is a non-contact current sensing method, so that it can prevent the affect of the system to be detected. Compared with the prior art, the present invention does not need external electricity for driving the passive alternating current sensor, which means the passive alternating current sensor can generate the necessary electricity for itself, and does not need to configure the coil with a lot of rounds for enhancing its sensitivity. Thus, the present invention can prevent the heat generated by the flexible structure layer caused by the power consumption of the current-carrying coil, which may further affect the operation in the sensing process. Besides, since the flexible structure layer is made of a single-crystal silicon material, the passive alternating current sensor of the present invention can resist the fatigue and aging problems after being used for a long term.

In addition, the present invention combines the piezoelectric element, magnetic body and flexible structure layer, which together form a piezoelectric energy harvester for generating energy to the signal transmitting unit, so that the entire passive alternating current sensor does not need the external power source but can individually operate to sense the current and output the detection result. Accordingly, the present can make the installation of the passive alternating current sensor more easily.

Otherwise, the piezoelectric element, the magnetic body, and the flexible structure layer may be applied to a second measuring circuit, so that the passive alternating current sensor can provide both the electromagnetic and piezoelectric current sensing mechanisms. Accordingly, the sensitivity of the passive alternating current sensor of the present invention can be enhanced, and the application range thereof can be further spread.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A passive alternating current sensor for sensing a current-carrying conductor, the passive alternating current sensor comprising:
    a substrate having a flexible structure layer;
    a magnetic body disposed corresponding to the current-carrying conductor and is located at one side of the substrate;
    at least a coil disposed on the substrate and correspondingly winding around the magnetic body; and
    a first measuring circuit connected with the coil;
    wherein, when the magnetic body is subjected to the magnetic field generated by the current-carrying conductor and enabled a relative motion with the coil, the coil produces an induced electromotive force, and the first measuring circuit measures the induced electromotive force and accordingly outputs a first induction signal.

2. The passive alternating current sensor according to claim 1, wherein the substrate is a single-crystal silicon substrate.

3. The passive alternating current sensor according to claim 1, wherein the flexible structure layer is a suspended structure layer.

4. The passive alternating current sensor according to claim 1, wherein the coil comprises a metal thin film.

5. The passive alternating current sensor according to claim 1, further comprising:
    an insulating layer disposed between the substrate and the coil.

6. The passive alternating current sensor according to claim 1, further comprising:
    a signal transmitting unit connected with the first measuring circuit.

7. The passive alternating current sensor according to claim 6, further comprising:
    a piezoelectric element disposed on the substrate;
    wherein, the piezoelectric element, the magnetic body, and the flexible structure layer together form a piezoelectric energy harvester, and when the magnetic body is subjected to the magnetic field generated by the current-carrying conductor so as to generate a magnetic force, which is applied to the flexible structure layer, the flexible structure layer accordingly generates a stress applied to the piezoelectric element so as to produce a potential difference between two ends of the piezoelectric element for providing energy to the signal transmitting unit.

8. The passive alternating current sensor according to claim 1, further comprising:
    a piezoelectric element disposed on the substrate; and
    a second measuring circuit connecting with the piezoelectric element, wherein when the magnetic body is subjected to the magnetic field generated by the current-carrying conductor so as to generate a magnetic force, which is applied to the flexible structure layer, the flexible structure layer accordingly generates a stress applied to the piezoelectric element so as to produce a potential difference between two ends of the piezoelectric element, and the second measuring circuit measures the potential difference between the two ends of the piezoelectric element and outputs a second induction signal according to the potential difference between the two ends of the piezoelectric element.

9. The passive alternating current sensor according to claim 7, wherein the piezoelectric element comprises a piezoelectric thin film.

10. The passive alternating current sensor according to claim 8, wherein the piezoelectric element comprises a piezoelectric thin film.

\* \* \* \* \*